(12) United States Patent
Pillarisetty et al.

(10) Patent No.: US 8,129,749 B2
(45) Date of Patent: Mar. 6, 2012

(54) DOUBLE QUANTUM WELL STRUCTURES FOR TRANSISTORS

(75) Inventors: Ravi Pillarisetty, Portland, OR (US); Mantu K. Hudait, Portland, OR (US); Marko Radosavljevic, Beaverton, OR (US); Gilbert Dewey, Hillsboro, OR (US); Titash Rakshit, Hillsboro, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 14 days.

(21) Appl. No.: 12/058,063

(22) Filed: Mar. 28, 2008

(65) Prior Publication Data
US 2009/0242872 A1 Oct. 1, 2009

(51) Int. Cl.
H01L 29/66 (2006.01)
(52) U.S. Cl. ............ 257/192; 257/20; 257/200; 257/280
(58) Field of Classification Search .................... 257/20, 257/192, 200, 280
See application file for complete search history.

(56) References Cited

U.S. PATENT DOCUMENTS

| | | | |
|---|---|---|---|
| 5,783,478 A | 7/1998 | Chau et al. | |
| 5,949,095 A * | 9/1999 | Nagahara et al. | ............. 257/192 |
| 6,373,112 B1 | 4/2002 | Murthy et al. | |
| 6,621,131 B2 | 9/2003 | Murthy et al. | |
| 6,645,831 B1 | 11/2003 | Shaheen et al. | |
| 6,797,556 B2 | 9/2004 | Murthy et al. | |
| 6,812,086 B2 | 11/2004 | Murthy et al. | |
| 6,825,506 B2 | 11/2004 | Jin et al. | |
| 6,858,478 B2 | 2/2005 | Chau et al. | |
| 6,861,318 B2 | 3/2005 | Murthy et al. | |
| 6,885,084 B2 | 4/2005 | Murthy et al. | |
| 6,887,395 B2 | 5/2005 | Hareland et al. | |
| 6,897,098 B2 | 5/2005 | Hareland et al. | |
| 6,900,481 B2 | 5/2005 | Jin et al. | |
| 6,909,151 B2 | 6/2005 | Hareland et al. | |
| 6,914,295 B2 | 7/2005 | Chau et al. | |
| 6,933,589 B2 | 8/2005 | Murthy et al. | |
| 6,972,228 B2 | 12/2005 | Doyle et al. | |
| 6,974,733 B2 | 12/2005 | Boyanov et al. | |
| 6,974,738 B2 | 12/2005 | Hareland et al. | |
| 7,005,366 B2 | 2/2006 | Chau et al. | |
| 7,042,009 B2 | 5/2006 | Shaheen et al. | |
| 7,105,390 B2 | 9/2006 | Brask et al. | |

(Continued)

OTHER PUBLICATIONS

Shaheen, Mohamad et al., "High Mobility Tri-Gate Devices and Methods of Fabrication", U.S. Patent Application filed on Dec. 1, 2006 assigned U.S. Appl. No. 11/332,189.

(Continued)

*Primary Examiner* — Tan N Tran
(74) *Attorney, Agent, or Firm* — Laleh Jalali

(57) ABSTRACT

Double quantum well structures for transistors are generally described. In one example, an apparatus includes a semiconductor substrate, one or more buffer layers coupled to the semiconductor substrate, a first barrier layer coupled to the one or more buffer layers, a first quantum well channel coupled with the first barrier layer wherein the first quantum well channel includes a group III-V semiconductor material or a group II-VI semiconductor material, or combinations thereof, a second barrier layer coupled to the first quantum well channel, and a second quantum well channel coupled to the barrier layer wherein the second quantum well channel includes a group III-V semiconductor material or a group II-VI semiconductor material, or combinations thereof.

10 Claims, 4 Drawing Sheets

U.S. PATENT DOCUMENTS

| | | | |
|---|---|---|---|
| 7,138,316 | B2 | 11/2006 | Jin et al. |
| 7,145,246 | B2 | 12/2006 | Hareland et al. |
| 7,176,075 | B2 | 2/2007 | Jin et al. |
| 7,180,109 | B2 | 2/2007 | Jin et al. |
| 7,193,279 | B2 | 3/2007 | Doyle et al. |
| 7,235,809 | B2 | 6/2007 | Jin et al. |
| 7,241,653 | B2 | 7/2007 | Hareland et al. |
| 7,268,058 | B2 | 9/2007 | Jin et al. |
| 7,279,375 | B2 | 10/2007 | Radosavljevic et al. |
| 7,285,829 | B2 | 10/2007 | Doyle et al. |
| 7,358,121 | B2 | 4/2008 | Chau et al. |
| 2002/0031153 | A1* | 3/2002 | Niwa et al. .............. 372/45 |
| 2003/0001165 | A1* | 1/2003 | Taki ......................... 257/94 |
| 2004/0113210 | A1 | 6/2004 | Chau et al. |
| 2004/0191980 | A1 | 9/2004 | Rios et al. |
| 2005/0124125 | A1 | 6/2005 | Jin et al. |
| 2005/0285098 | A1* | 12/2005 | Fathimulla et al. ......... 257/20 |
| 2007/0123003 | A1 | 5/2007 | Brask et al. |
| 2008/0029756 | A1 | 2/2008 | Hudait et al. |
| 2008/0032478 | A1 | 2/2008 | Hudait et al. |
| 2008/0073639 | A1 | 3/2008 | Hudait et al. |
| 2008/0076235 | A1 | 3/2008 | Hudait et al. |
| 2008/0079003 | A1 | 4/2008 | Shaheen et al. |
| 2008/0079094 | A1 | 4/2008 | Jin et al. |
| 2008/0085580 | A1 | 4/2008 | Doyle et al. |
| 2008/0128745 | A1* | 6/2008 | Mastro et al. ............. 257/184 |

OTHER PUBLICATIONS

Jin, Been Y., et al., "Non-Planar PMOS Structure with a Strained Channel Region and an Integrated Strained CMOS Flow", U.S. Patent Application filed on Dec. 20, 2007 assigned U.S. Appl. No. 12/004,706.

Jin, Been Y., et al., "Mechanism for Forming a Remote Delta Doping Layer of a Quantum Well Structure", U.S. Patent Application filed on Mar. 29, 2007 assigned U.S. Appl. No. 11/731,266.

Dutta, Suman et al., "Strain-Inducing Semiconductor Regions", U.S. Patent Application filed on Jun. 9, 2006 assigned U.S. Appl. No. 11/450,745.

Hudait, Mantu et al., "SB-Based CMOS Device", U.S. Patent Application filed on Nov. 16, 2006 assigned U.S. Appl. No. 11/560,494.

Shaheen, Mohamad et al., "Thin III-V Semiconductor Films With High Electron Mobility", U.S. Patent Application filed on Dec. 4, 2006 assigned U.S. Appl. No. 11/633,953.

Kavalieros, Jack T., et al., "An Apparatus and Method for Selectively Recessing Spacers on Multi-Gate Devices", U.S. Patent Application filed on Sep. 15, 2006 assigned U.S. Appl. No. 11/521,624.

Hudait, Mantu et al., "Improved Dopant Confinement in the Delta Doped Layer Using a Dopant Segregation Barrier in Quantum Well Structures", U.S. Patent Application filed on Dec. 29, 2006 assigned U.S. Appl. No. 11/647,989.

Dutta, Suman et al., "Insulated Gate for Group III-V Devices", U.S. Patent Application filed on Dec. 13, 2006 assigned U.S. Appl. No. 11/610,415.

Shah, Uday et al., "CMOS Structure and Method of Manufacturing Same", U.S. Patent Application filed on Mar. 30, 2007 assigned U.S. Appl. No. 11/731,163.

Doyle, Brian et al., "Multi-Gate Structure and Method of Doping Same", US. Patent Application filed on Mar. 28, 2007 assigned U.S. Appl. No. 11/729,198.

Hudait, Mantu et al., "A Buffer Architecture Formed on a Semiconductor Wafer", U.S. Patent Application filed on Mar. 1, 2007 assigned U.S. Appl. No. 11/712,614.

Hudait, Mantu et al., "Forming Arsenide-Based Complementary Logic on a Single Substrate", U.S. Patent Application filed on Feb. 28, 2007 assigned U.S. Appl. No. 11/712,191.

Chui, Chi O., et al., "Forming a Type I Heterostructure in a Group IV Semiconductor", U.S. Patent Application filed on Mar. 27, 2007 assigned U.S. Appl. No. 11/728,890.

Chui, Chi O., et al., "Forming a Non-Planar Transistor Having a Quantum Well Channel", U.S. Patent Application filed on Mar. 27, 2007 assigned U.S. Appl. No. 11/728,891.

Jin, Been Y., et al., "Transistor Having Tensile Strained Channel and System Including Same", U.S. Patent Application filed on Mar. 29, 2007 assigned U.S. Appl. No. 11/729,564.

Jin, Been Y., et al., "Method to Introduce Uniaxial Strain in Multigate Nanoscale Transistors by Self Aligned SI to SIGE Conversion Processes and Structures Formed Thereby", U.S. Patent Application filed on Sep. 28, 2007 assigned U.S. Appl. No. 11/864,726.

Jin, Been Y., et al., "Silicon Germanium and Germanium Multigate and Nanowire Structures for Logic and Multilevel Memory Applications", U.S. Patent Application filed on Mar. 29, 2007 assigned U.S. Appl. No. 11/729,565.

Hudait, Mantu et al., "High Hole Mobility Semiconductor Device", U.S. Patent Application filed on Jun. 28, 2007 assigned U.S. Appl. No. 11/823,516.

Jin, Been Y., et al., "Three Dimensional Quantum Dot Array", U.S. Patent Application filed on Jun. 28, 2007 assigned U.S. Appl. No. 11/823,758.

Pillarisetty, Ravi et al., "Apparatus and Methods for Improving Multi-Gate Device Perfomace", U.S. Patent Application filed on Mar. 14, 2008 assigned U.S. Appl. No. 12/049,078.

\* cited by examiner

DOUBLE QUANTUM WELL STRUCTURES FOR TRANSISTORS

BACKGROUND

Generally, group III-V semiconductor thin films are emerging as material structures upon which transistors may be formed for electronic or optoelectronic devices.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

Figure 1:
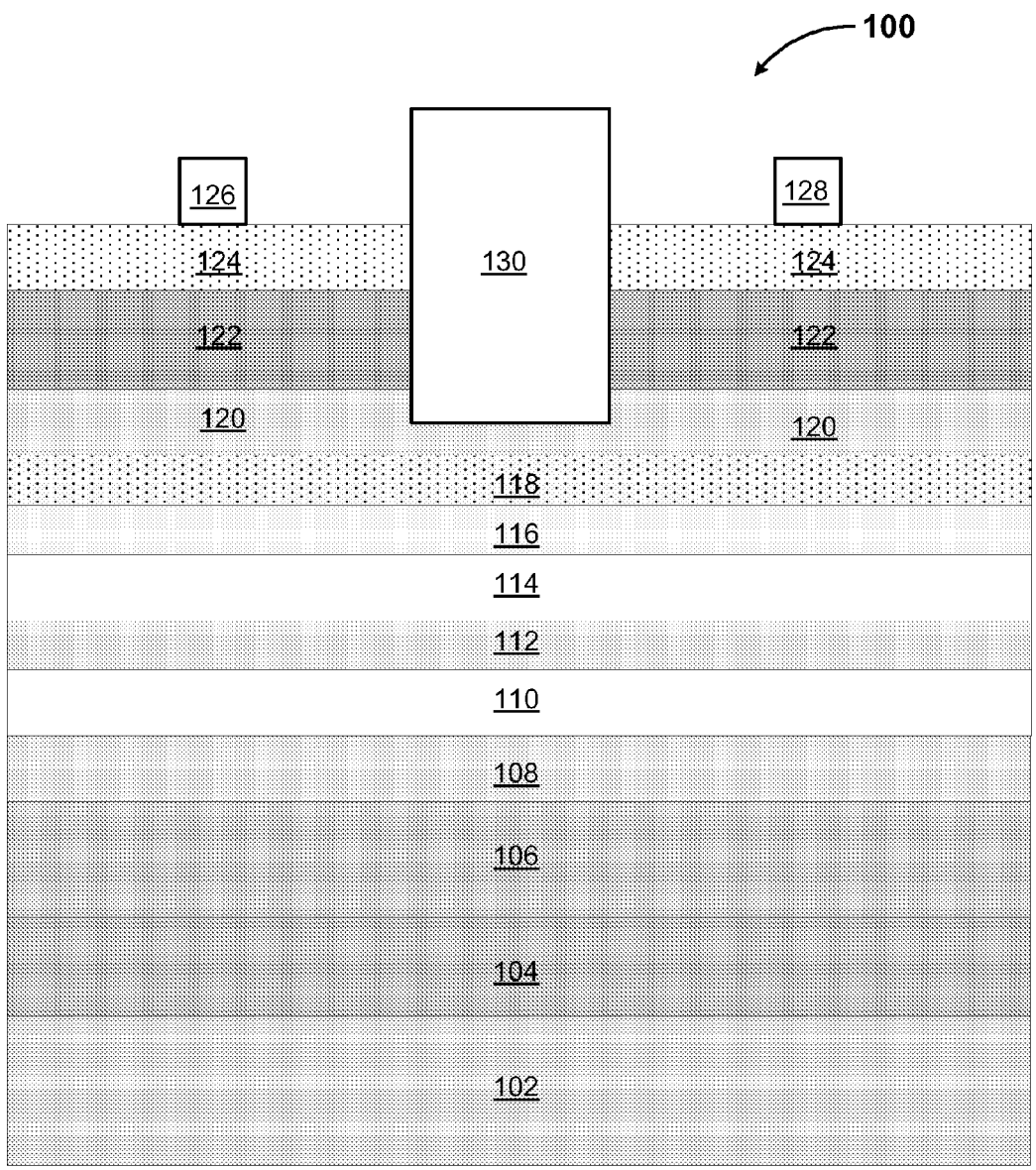
FIG. 1 is an elevation cross-section schematic of a semiconductor heterostructure incorporating a double quantum well structure, according to but one embodiment.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of double quantum-well structures for transistors are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

FIG. 1 is an elevation cross-section schematic of a semiconductor heterostructure incorporating a double quantum-well structure, according to but one embodiment. In an embodiment, a semiconductor heterostructure 100 includes a semiconductor substrate 102, a buffer layer 104, a graded buffer layer 106, a first barrier layer 108, a first quantum-well channel 110, a second barrier layer 112, a second quantum-well channel 114, a spacer layer 116, a doped layer 118, a third barrier layer 120, an etch-stop layer 122, and a contact layer 124, coupled as shown. In another embodiment, a semiconductor heterostructure 100 is coupled to a source structure 126, a drain structure 128, and a gate electrode structure 130, coupled as shown.

Quantum-well transistors comprising a source structure 126, a drain structure 128, and/or a gate electrode structure 130 may be formed in a semiconductor heterostructure 100. One or more layers of semiconductor heterostructure 100 may be epitaxially deposited. In an embodiment, semiconductor heterostructure 100 comprises group III-V semiconductor materials. In other embodiments, a semiconductor heterostructure 100 includes group II-VI semiconductor materials or other suitable materials. Transistors formed in semiconductor heterostructure 100 may have higher carrier mobility than conventional silicon transistors. Higher carrier mobility in a semiconductor heterostructure 100 may result from reduced impurity scattering due to doped layer 118 and/or a relatively lower effective mass that provides significantly fewer charge carriers in the quantum-well channels 110, 114 in the "on" state compared to conventional silicon transistors.

A semiconductor heterostructure 100 may include a double quantum-well structure comprising a first quantum-well channel 110, a second quantum-well channel 114, and a barrier layer 112 disposed between the first quantum well channel 110, and the second quantum-well channel 114. A double quantum-well structure 110, 112, 114 may increase total charge carrier density and drive current compared to a single quantum-well structure. In an embodiment, a double quantum-well structure 110, 112, 114 approximately doubles carrier charge density or increases carrier charge density by a factor of about two. The benefit of increased carrier density may be obtained without significant loss to carrier mobility. A transistor that incorporates a double quantum-well structure 110, 112, 114 may, for example, maintain higher carrier mobility at high carrier densities compared to a transistor that incorporates a single quantum-well structure.

Semiconductor heterostructure 100 may be used to form n-type metal-oxide-semiconductor (NMOS) or p-type metal-oxide-semiconductor (PMOS) devices including, for example, logic, analog, or memory devices, or combinations thereof. In an embodiment, a semiconductor heterostructure 100 includes a semiconductor substrate 102. A semiconductor substrate 102 may include n-type or p-type (100) off-oriented silicon, the crystalline directions of the substrate 102 being symbolized by the convention (xyz), where x, y, and z are crystallographic planes in three dimensions that are perpendicular to one another. In an embodiment, semiconductor substrate 102 includes material of a (100) direction off-cut in a range between about 2 degrees to 8 degrees towards a (110) direction. In other embodiments, other off-cut orientations or a substrate 102 without an off-cut orientation may be used. In another embodiment, semiconductor substrate 102 has a high resistivity between about 1 Ω-cm to 50 kΩ-cm. A high resistivity substrate 102 may provide for device isolation and off-cutting may eliminate anti-phase domains in anti-phase boundaries.

One or more buffer layers 104, 106 may be coupled to the semiconductor substrate 102. In an embodiment, one or more buffer layers 104, 106 comprise a nucleation buffer layer 104 and a graded buffer layer 106. A nucleation buffer layer 104 comprises gallium arsenide (GaAs) in one embodiment. Other material systems may be used to form nucleation buffer layer 104 including NMOS or PMOS material systems. In an embodiment, a nucleation buffer layer 104 is used to fill semiconductor substrate 102 terraces with atomic bi-layers of a semiconductor material including, for example, one or more group III-V semiconductor materials, one or more group II-VI semiconductor materials, or combinations thereof. A nucleation portion of nucleation buffer layer 104 may create a virtual polar substrate 102. Such nucleation portion may have a thickness between about 3 nanometers (nm) and 50 nm in one or more embodiments. A buffer layer portion of nucleation buffer layer 104 may serve as a buffer against dislocation threading and/or provide control of a lattice mismatch of about 4% to 8% between a semiconductor substrate 102 and a first barrier layer 108. The buffer layer portion of nucleation buffer layer 104 may have a thickness between about 0.3 microns and 5 microns, in one or more embodiments.

A graded buffer layer 106 may be coupled to a nucleation buffer layer 104. Graded buffer layer may comprise group III-V semiconductor material, group II-VI semiconductor material, or combinations thereof, including, for example, indium aluminum arsenide ($In_xAl_{1-x}As$), in which x has a value between 0 and 1, representing the relative composition of the elements. In one embodiment, x comprises values between about 0 and 0.52. In another embodiment, graded buffer layer 106 comprises indium aluminum antimonide (InAlSb). Other material systems including NMOS or PMOS materials may be used for graded buffer layer 106 in other embodiments. Graded buffer layer 106 may have a thickness between about 0.5 microns and 2 microns in various embodiments. In an embodiment, graded buffer layer 106 comprises inverse graded InAlAs or indium gallium aluminum arsenide (InGaAlAs) to provide a larger bandgap for device isolation. Increasing the relative percentage of Al in the graded buffer layer 106 may increase strain to quantum-well channels 110, 114. A graded buffer layer 106 may also provide stress relaxation between semiconductor substrate 102 and other lattice mismatched layers such as first barrier layer 108.

Together, nucleation buffer layer 104 and graded buffer layer 106 may form a dislocation filtering buffer. One or more buffer layers 104, 106 may provide compressive strain for one or more quantum-well channels 110, 114. One or more buffer layers 104, 106 may further provide a buffer for lattice control mismatch between semiconductor substrate 102 and other layers such as first barrier layer 108 to reduce threading dislocation defects in semiconductor heterostructure 100.

A first barrier layer 108 may be coupled to the one or more buffer layers 104, 106. First barrier layer 108 may comprise group III-V semiconductor material, group II-VI semiconductor material, or combinations thereof, including, for example, indium aluminum arsenide ($In_xAl_{1-x}As$), in which x has a value between 0 and 1, representing the relative composition of the elements. In an embodiment, x comprises a value between about 0.5 and 0.8. In another embodiment, a first barrier layer 108 comprises indium aluminum antimonide (InAlSb). Other material systems including NMOS materials and/or PMOS materials may be used for a first barrier layer 108 in other embodiments. First barrier layer 108 may comprise a material that has a higher bandgap than a material used for one or more quantum-well channels 110, 114. First barrier layer 108 may comprise a thickness sufficient to provide a potential barrier to charge carriers in semiconductor heterostructure 100. In an embodiment, first barrier layer 108 has a thickness of about 10 nm to 200 nm.

A first quantum well channel 110 may be coupled with the first barrier layer 108. First quantum well channel 110 may comprise group III-V semiconductor material, group II-VI semiconductor material, or combinations thereof, including, for example, indium gallium arsenide ($In_xGa_{1-x}As$), in which x has a value between 0 and 1, representing the relative composition of the elements. In an embodiment, x comprises values between about 0.5 and 0.8. A first quantum-well channel 110 may comprise indium antimonide (InSb). A first quantum-well channel 110 may include various other material systems in other embodiments including NMOS and PMOS materials. A material of a first quantum-well channel 110 may have a smaller bandgap than a material of a first barrier layer 108. In an embodiment, first quantum-well channel 110 comprises a thickness that provides sufficient channel conductance. A first quantum-well channel 110 may have a thickness between about 2 nm to 15. In other embodiments, first quantum-well channel 110 may include other thicknesses.

A first quantum-well channel 110 may experience increased short-channel effects relative to a second quantum-well channel 114 as a result of being farther from a gate electrode structure 130. A thickness for first quantum-well channel 110 may be selected to mitigate such short-channel effects. For example, a thickness of a first quantum-well channel 110 in a given device may be reduced to mitigate short-channel effects. However, reducing the thickness of first quantum-well channel 110 may also undesirably reduce drive current. A first quantum-well channel 110 thickness may be selected to comprehend or balance these conflicting effects. For example, a thickness for first quantum-well channel 110 in a logic device may be selected to be thinner than a thickness for first quantum-well channel 110 in an analog device because, in various embodiments, a logic device architecture may be more susceptible to short-channel effects than an analog device architecture. In another embodiment, a thickness for a first quantum-well channel 110 is selected to provide sufficient gate 130 control of the first quantum-well channel 110.

In other embodiments, thicknesses for a second barrier layer 112 and a second quantum-well channel 110 are selected to reduce short-channel effects. In an embodiment, selecting a thinner second barrier layer 112 and thinner second quantum-well channel 110 for a given device reduces short-channel effects by reducing the distance between a gate electrode structure 130 and first quantum-well channel 110.

A second barrier layer 112 may be coupled to the first quantum-well channel 110. In an embodiment, first quantum-well channel 110 is isolated from second quantum-well channel 114 by second barrier layer 112. Second barrier layer 112 may comprise group III-V semiconductor material, group II-VI semiconductor material, or combinations thereof, including, for example, indium aluminum arsenide (InAlAs), aluminum arsenide (AlAs), indium aluminum antimonide (InAlSb), or combinations thereof. A second barrier layer 112 may include various other material systems such as NMOS or PMOS materials in other embodiments. A material of a second barrier layer 112 may have a larger bandgap than a material of a first quantum-well channel 110 and second quantum-well 114. In an embodiment, a second barrier layer 112 comprises a thickness to reduce short-channel effects in accordance with principles already described herein. In one embodiment, a second barrier layer 112 comprises a thickness of about 1 nm to 6 nm. A second barrier layer 112 may comprise other thicknesses in other embodiments.

A second quantum well channel 114 may be coupled to the second barrier layer 112. Second quantum-well channel 114 may comprise group III-V semiconductor material, group II-VI semiconductor material, or combinations thereof, including, for example, indium gallium arsenide ($In_xGa_{1-x}As$), in which x has a value between 0 and 1, representing the relative composition of the elements. In an embodiment, x comprises values between about 0.5 and 0.8. A second quantum-well channel 114 may comprise indium antimonide (InSb) in other embodiments. A second quantum-well channel 114 may include various other material systems including NMOS or PMOS materials in other embodiments. A material of a second quantum-well channel 114 may have a smaller bandgap than a material of a second barrier layer 112. First and second quantum-well channels 110, 114 may provide high electron mobility and velocity for NMOS devices and/or provide high hole mobility and velocity for PMOS devices compared to a Si-based device.

In an embodiment, second quantum-well channel 114 comprises a thickness that provides sufficient channel conductance. A second quantum-well channel 114 may have a thickness between about 2 nm to about 15 nm. In other embodiments, second quantum-well channel 114 may include other thicknesses. A second quantum-well channel 114 may comprise a thickness to reduce short-channel effects in accordance with principles described herein.

Semiconductor heterostructure 100 may further include a spacer layer 116 coupled to the second quantum-well channel 114. Spacer layer 116 may provide carrier confinement and/or reduce interaction between a doped layer 118 and second quantum-well channel 114. Spacer layer 116 may comprise group III-V semiconductor material, group II-VI semiconductor material, or combinations thereof, including, for example, indium aluminum arsenide ($In_xAl_{1-x}As$), in which x comprises a value between 0 and 1, representing the relative composition of the elements. In an embodiment, x comprises values between about 0.5 and 0.8. In another embodiment, spacer layer 116 comprises indium aluminum antimonide (InAlSb). Other material systems may be used to form spacer layer 116 including NMOS or PMOS materials systems. Spacer layer 116 may comprise a thickness of about 2 nm to 15 nm and may include other thicknesses in other embodiments. Spacer layer 116 may further provide strain to the first and/or second quantum-well channels 114, 116. For example, in an embodiment in which spacer layer 116 comprises InAlAs or InAlSb, an increase in the relative percentage of Al in the spacer layer 116 may increase strain in the first and/or second quantum-well channels 114, 116.

A doped layer 118 may be coupled to the spacer layer 116. Doped layer 118 may be delta-doped, modulation doped and/or combinations thereof. In an embodiment, doped layer 118 comprises a semiconductor material. For an NMOS device, doped layer 118 may be doped with silicon (Si), tellurium (Te), or combinations thereof. For a PMOS device, doped layer 118 may be doped with beryllium (Be), carbon (C), or combinations thereof. Other impurities may be used in doped layer 118 in other embodiments. In an embodiment, doped layer 118 comprises a thickness of about 3 angstroms to 5 angstroms. Other thicknesses for doped layer 118 may be used in other embodiments.

A third barrier layer 120 may be coupled to the doped layer 118. Third barrier layer 120 may comprise group III-V semiconductor material, group II-VI semiconductor material, or combinations thereof, including, for example, indium aluminum arsenide ($In_xAl_{1-x}As$), in which x has a value between 0 and 1, representing the relative composition of the elements. In an embodiment x comprises a value between about 0.5 and 0.8. In another embodiment, third barrier layer 120 comprises InAlSb. Other material systems including NMOS materials and/or PMOS materials may be used for a third barrier layer 120 in other embodiments. Third barrier layer 120 may comprise a material that has a higher bandgap than a material used for one or more quantum-well channels 110, 114. Third barrier layer 120 may comprise a Schottky-barrier layer for gate 130 control. In an embodiment, third barrier layer 120 has a thickness of about 2 nm to 15 nm. Other thicknesses for a third barrier layer 120 may be implemented in other embodiments.

An etch stop layer 122 may be coupled to the third barrier layer 120. Etch-stop layer 122 may comprise group III-V semiconductor material, group II-VI semiconductor material, or combinations thereof, including, for example, indium phosphide (InP), InAlSb, or suitable combinations thereof. Other material systems including NMOS materials and/or PMOS materials may be used for etch-stop layer 122 in other embodiments. In an embodiment, etch-stop layer 122 may comprise a thickness of about 2 nm to 15 nm. Other thicknesses for etch-stop layer 122 may be implemented in other embodiments.

A contact structure 124 may be coupled to the etch-stop layer 122. Contact structure 124 may provide source 126 and drain 128 electrodes with low contact resistance. Contact structure 124 may comprise group III-V semiconductor material, group II-VI semiconductor material, or combinations thereof, including, for example, InGaAs. Other material systems including NMOS materials and/or PMOS materials may be used for contact structure 124 in other embodiments. In an NMOS embodiment, contact structure 124 may be doped with n-type impurities. In a PMOS embodiment, contact structure 124 may be doped with p-type impurities. In an embodiment, contact structure 124 comprises a thickness of about 5 to 50 nm. Other thicknesses of a contact structure 124 may be used in other embodiments.

A source structure 126 and a drain structure 128 may be coupled to the contact structure 124. In an embodiment, source structure 126 and drain structure 128 comprise an electrode material. A gate electrode structure 130 may be formed in a recessed area of contact structure 124, etch-stop layer 122, and third barrier layer 120. A gate dielectric material (not shown) and a gate electrode 130 material may be deposited in an area of layers 120, 122, 124 recessed by an etch process. Thus, a Schottky junction may be formed through which gate electrode structure 130 may control first quantum-well channel 110 and second quantum-well channel 114. An electronic device may include one or more transistors wherein the first and second quantum wells 110, 114 are channels of the one or more transistors. A transistor may comprise a source structure 126 coupled to a contact structure 124, a drain structure coupled to the contact structure 124, and a gate electrode structure coupled to the third barrier layer 120, the etch-stop layer 122, and the contact structure 124.

Various layers of semiconductor heterostructure 100 may be deposited by epitaxial deposition methods in one or more embodiments. Buffer layer 104, graded buffer layer 106, first barrier layer 108, first quantum-well channel 1 10, second barrier layer 1 12, second quantum-well channel 114, spacer layer 116, doped layer 118, or third barrier layer 120 may be deposited by molecular beam epitaxy (MBE), atomic layer epitaxy (ALE), epitaxial growth, chemical beam epitaxy (CBE), metal-organic chemical vapor deposition (MOCVD), or combinations thereof. Other suitable deposition methods may be used in other embodiments.

Figure 2:
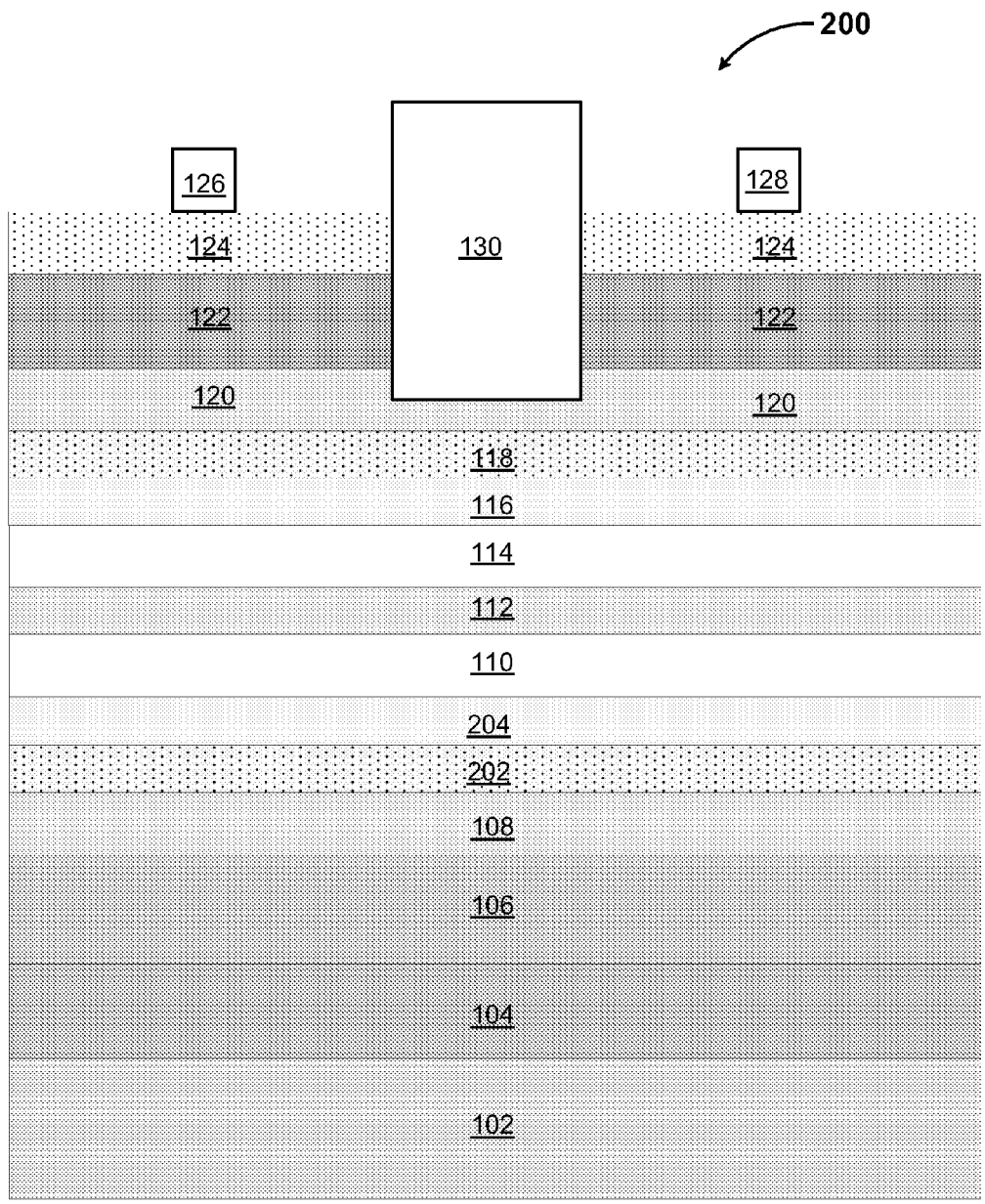
FIG. 2 is another elevation cross-section schematic of a semiconductor heterostructure incorporating a double quantum well structure, according to but one embodiment.

FIG. 2 is another elevation cross-section schematic of a semiconductor heterostructure incorporating a double quantum-well structure, according to but one embodiment. In an embodiment, semiconductor heterostructure 200 includes a semiconductor substrate 102, a buffer layer 104, a graded buffer layer 106, a first barrier layer 108, a doped layer 202, a spacer layer 204, a first quantum-well channel 110, a second barrier layer 112, a second quantum-well channel 114, a spacer layer 116, a doped layer 118, a third barrier layer 120, an etch-stop layer 122, and a contact layer 124, coupled as shown. In another embodiment, a semiconductor heterostructure 200 is coupled to a source structure 126, a drain structure 128, and a gate electrode structure 130, coupled as shown.

Semiconductor heterostructure 200 may include a doped layer 202 coupled to the first barrier layer 108. Doped layer 202 may be delta-doped, modulation doped and/or combinations thereof. In an embodiment, doped layer 202 comprises a semiconductor material. For an NMOS device, doped layer 202 may be doped with silicon (Si), tellurium (Te), or combinations thereof. For a PMOS device, doped layer 202 may be doped with beryllium (Be), carbon (C), or combinations thereof. Other impurities may be used in doped layer 202 in other embodiments. In an embodiment, doped layer 202 comprises a thickness of about 3 angstroms to 5 angstroms. Other thicknesses for doped layer 202 may be used in other embodiments.

A spacer layer 204 may be coupled to the doped layer 202. In an embodiment, spacer layer 204 is coupled to the doped layer 202 such that the first quantum-well channel 110 is coupled with the barrier layer through the intervening doped layer 202 and the spacer layer 204, the first quantum-well channel 110 being coupled to the spacer layer 204. In another embodiment, the spacer layer 204 is coupled to the doped layer and the first quantum-well channel 110 is epitaxially coupled to the doped layer.

Spacer layer 204 may provide carrier confinement and/or reduce interaction between a Doped layer 202 and first quantum-well channel 110. Spacer layer 204 may comprise group III-V semiconductor material, group II-VI semiconductor material, or combinations thereof, including, for example, indium aluminum arsenide ($In_xAl_{1-x}As$), in which x comprises a value between 0 and 1, representing the relative composition of the elements. In an embodiment, x comprises values between about 0.5 and 0.8. In another embodiment, spacer layer 204 comprises indium aluminum antimonide (InAlSb). Spacer layer 204 may comprise a thickness of about 2 nm to 15 nm and may include other thicknesses in other embodiments. Spacer layer 204 may further provide strain to the first and/or second quantum-well channels 114, 116. For example, in an embodiment where spacer layer 204 comprises InAlAs or InAlSb, an increase in the relative percentage of Al may increase strain in the first and/or second quantum-well channels 114, 116.

Figure 3:
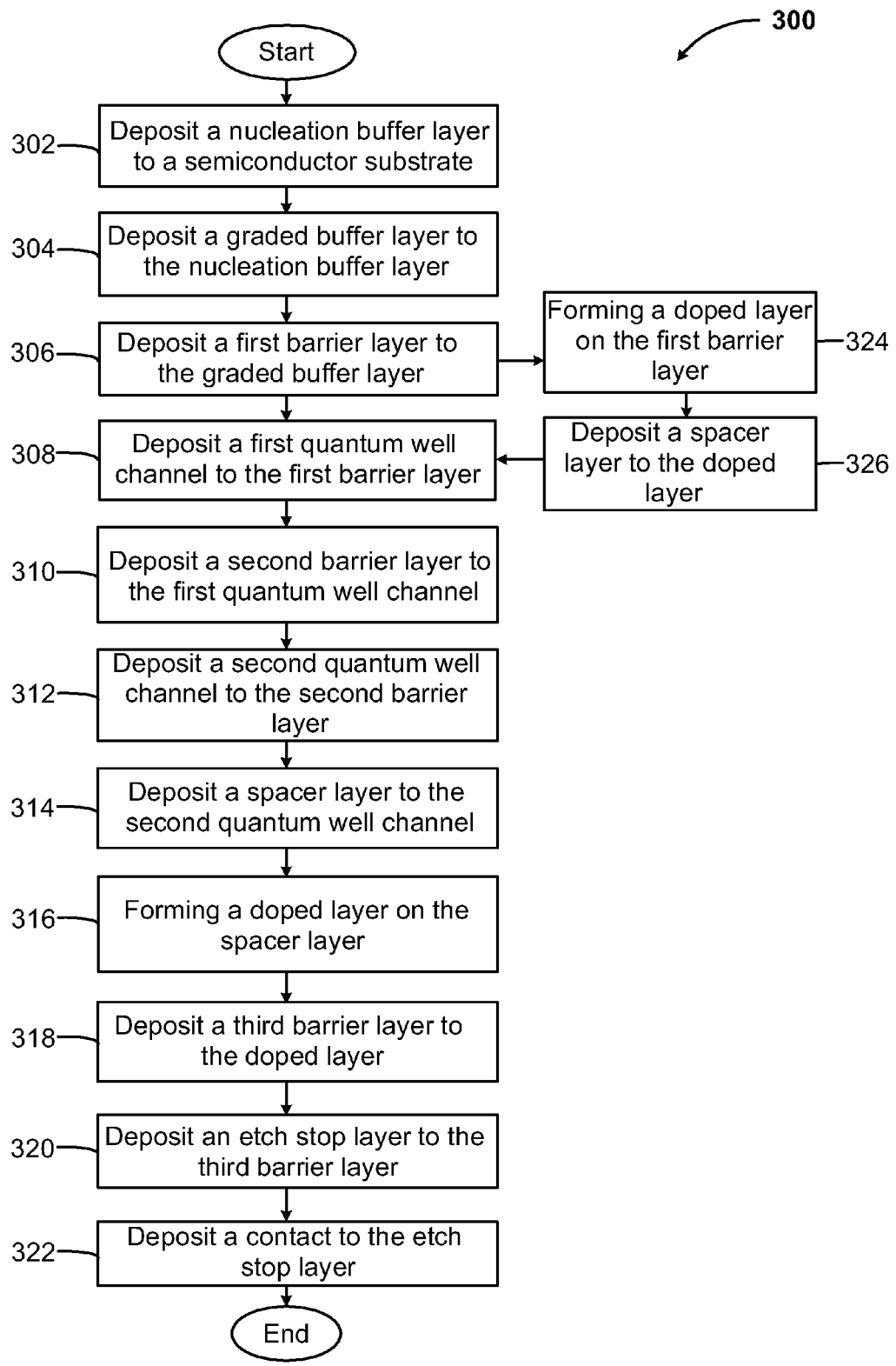
FIG. 3 is a flow diagram of a method for fabricating a semiconductor heterostructure incorporating a double quantum well structure, according to but one embodiment.

FIG. 3 is a flow diagram of a method for fabricating a semiconductor heterostructure incorporating a double quantum-well structure, according to but one embodiment. In an embodiment, a method 300 includes depositing a nucleation buffer layer to a semiconductor substrate at box 302, depositing a graded buffer layer to the nucleation buffer layer at box 304, depositing a first barrier layer to the graded buffer layer at box 306, depositing a first quantum-well channel to the first barrier layer at box 308, depositing a second barrier layer to the first quantum-well channel at box 310, depositing a second quantum-well channel to the second barrier layer at box 312, depositing a spacer layer to the second quantum-well channel at box 314, forming a doped layer on the spacer layer at box 316, depositing a third barrier layer to the doped layer at box 318, depositing an etch-stop layer to the third barrier layer at box 320, and depositing a contact to the etch-stop layer at box 322. In another embodiment, a method 300 further includes forming a doped layer on the first barrier layer at box 324 and depositing a spacer layer to the doped layer at box 326, where arrows suggest a flow according to one embodiment.

In an embodiment, a method 300 includes depositing one or more buffer layers to a semiconductor substrate 302, 304, depositing a first barrier layer to the one or more buffer layers 306, and depositing a first quantum-well channel such that the first quantum-well channel is coupled with the first barrier layer 308 wherein the first quantum-well channel comprises group III-V semiconductor material, group II-VI semiconductor material, or combinations thereof. In an embodiment, depositing a first quantum-well channel such that the first quantum-well channel is coupled with the first barrier layer 308 includes forming a doped layer on the first barrier layer 324 prior to depositing the first quantum-well channel 308, and depositing a spacer layer to the doped layer 326 wherein the first quantum-well channel is coupled with the first barrier layer through the intervening doped layer and the spacer layer, the first quantum-well channel being coupled or deposited to the spacer layer. Forming a doped layer on the first barrier layer 324 may include depositing a semiconductor material to the first barrier layer and doping the semiconductor material with an impurity.

A method 300 may further include depositing a second barrier layer to the first quantum-well channel 310 and depositing a second quantum-well channel to the barrier layer 312 wherein the second quantum-well channel comprises a group III-V semiconductor material, group II-VI semiconductor material, or combinations thereof. In an embodiment, depositing the first quantum-well channel 308, depositing the second barrier layer 310, and/or depositing the second quantum-well channel 312 comprises depositing by molecular beam epitaxy (MBE), atomic layer epitaxy (ALE), epitaxial growth, chemical beam epitaxy (CBE), metal-organic chemical vapor deposition (MOCVD), or combinations thereof. Such deposition techniques may be used for the deposition actions of method 300 including forming a doped layer on the second quantum-well channel 316 and forming a doped layer on the first barrier layer 324. In other embodiments, other suitable deposition techniques are used for the deposition actions of method 300.

Depositing a first quantum-well channel 308 and depositing a second quantum-well channel 312 may include depositing a thickness of about 2 nm to 15 nm. Depositing a second barrier layer 310 may include depositing a thickness of about 1 nm to 6 nm. In other embodiments, different thicknesses may be used for depositing a first or second quantum-well channel 308, 312 or depositing a second barrier layer 310.

A method 300 may further include depositing a spacer layer to the second quantum well channel 314, forming a doped layer on the spacer layer 316, depositing a third barrier layer to the doped layer 318, depositing an etch stop layer to the third barrier layer 320, and depositing a contact structure to the etch stop layer 322. Forming a doped layer on the spacer layer 316 may include depositing a semiconductor material to the spacer layer and doping the semiconductor material with an impurity.

In an embodiment, depositing the first and second quantum well channels 308, 312 comprise depositing channels of a transistor. In this regard, a method 300 may further include forming a source structure of the transistor, the source structure being coupled to a contact structure, forming a drain structure of the transistor, the drain structure being coupled to the contact structure, and forming a gate electrode structure of the transistor, the gate electrode structure being coupled to a third barrier layer, an etch-stop layer, and the contact structure. Method 300 and the formation of other transistor structures may further include other semiconductor fabrication processes such as lithography, etch, thin films deposition, planarization, diffusion, metrology, or any other associated action with semiconductor fabrication. In one or more embodiments, method 300 incorporates embodiments already described with respect to FIGS. 1 and 2.

Various operations may be described as multiple discrete operations in turn, in a manner that is most helpful in understanding the claimed subject matter. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 4:
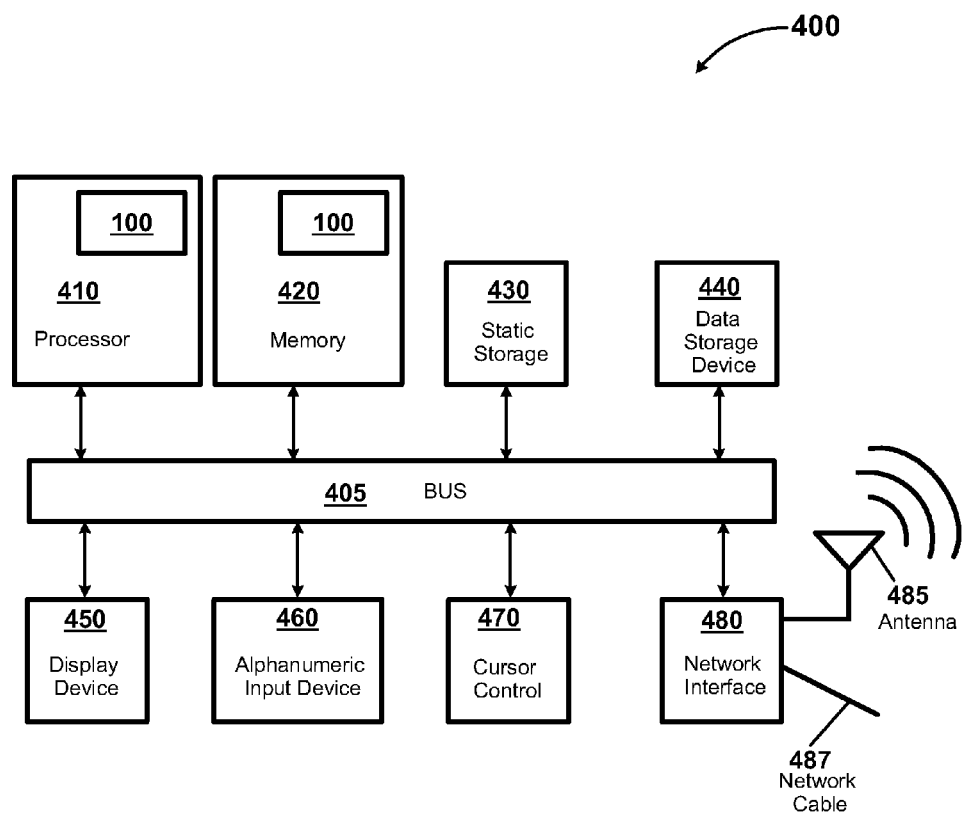
FIG. 4 is a diagram of an example system in which a semiconductor heterostructure as described herein may be used, according to but one embodiment.

FIG. 4 is a diagram of an example system in which a semiconductor heterostructure as described herein may be used, according to but one embodiment. System 400 is intended to represent a range of electronic systems (either wired or wireless) including, for example, desktop computer systems, laptop computer systems, personal computers (PC), wireless telephones, personal digital assistants (PDA) including cellular-enabled PDAs, set top boxes, pocket PCs, tablet PCs, DVD players, or servers, but is not limited to these examples and may include other electronic systems. Alternative electronic systems may include more, fewer and/or different components.

In one embodiment, electronic system 400 includes a semiconductor heterostructure 100 in accordance with embodiments described with respect to FIGS. 1-3. In an embodiment, a semiconductor heterostructure 100 as described herein is part of an electronic system's processor 410 or memory 420. Electronic system 400 may include a first electronic device, wherein the first electronic device comprises a processor 410 or memory 420, or combinations thereof. The first electronic device 410, 420 may include one or more transistors formed in a semiconductor heterostructure 100 that accords with embodiments described herein. In an embodiment, first electronic device 410, 420 comprises a p-type metal-oxide-semiconductor (PMOS) device or an n-type metal-oxide-semiconductor (NMOS) device. A second electronic device may be electrically coupled with the first electronic device. In an embodiment, second electronic device comprises another processor 410, memory 420, or combinations thereof.

Electronic system 400 may include bus 405 or other communication device to communicate information, and processor 410 coupled to bus 405 that may process information. While electronic system 400 may be illustrated with a single processor, system 400 may include multiple processors and/or co-processors. In an embodiment, processor 410 includes a semiconductor heterostructure 100 in accordance with embodiments described herein. System 400 may also include random access memory (RAM) or other storage device 420 (may be referred to as memory), coupled to bus 405 and may store information and instructions that may be executed by processor 410.

Memory 420 may also be used to store temporary variables or other intermediate information during execution of instructions by processor 410. Memory 420 is a flash memory device in one embodiment. In another embodiment, memory 420 includes a semiconductor heterostructure 100 as described herein.

System 400 may also include read only memory (ROM) and/or other static storage device 430 coupled to bus 405 that may store static information and instructions for processor 410. Data storage device 440 may be coupled to bus 405 to store information and instructions. Data storage device 440 such as a magnetic disk or optical disc and corresponding drive may be coupled with electronic system 400.

Electronic system 400 may also be coupled via bus 405 to display device 450, such as a cathode ray tube (CRT) or liquid crystal display (LCD), to display information to a user. Alphanumeric input device 460, including alphanumeric and other keys, may be coupled to bus 405 to communicate information and command selections to processor 410. Another type of user input device is cursor control 470, such as a mouse, a trackball, or cursor direction keys to communicate information and command selections to processor 410 and to control cursor movement on display 450.

Electronic system 400 further may include one or more network interfaces 480 to provide access to network, such as a local area network. Network interface 480 may include, for example, a wireless network interface having antenna 485, which may represent one or more antennae. Network interface 480 may also include, for example, a wired network interface to communicate with remote devices via network cable 487, which may be, for example, an Ethernet cable, a coaxial cable, a fiber optic cable, a serial cable, or a parallel cable.

In one embodiment, network interface 480 may provide access to a local area network, for example, by conforming to an Institute of Electrical and Electronics Engineers (IEEE) standard such as IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Previous or subsequent versions of the Bluetooth standard may also be supported.

In addition to, or instead of, communication via wireless LAN standards, network interface(s) 480 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

In an embodiment, a system 400 includes one or more omnidirectional antennae 485, which may refer to an antenna that is at least partially omnidirectional and/or substantially omnidirectional, and a processor 410 coupled to communicate via the antennae.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of this description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

What is claimed is:

1. An apparatus comprising:
   a semiconductor substrate;
   one or more buffer layers coupled to the semiconductor substrate;
   a first barrier layer coupled to the one or more buffer layers;
   a first quantum-well channel coupled with the first barrier layer wherein the first quantum-well channel comprises a group II-VI semiconductor material;

a second barrier layer coupled to the first quantum-well channel;

a second quantum-well channel coupled to the second barrier layer wherein the second quantum-well channel comprises a group II-VI semiconductor material;

a spacer layer coupled to the second quantum-well channel;

a doped layer coupled to the spacer layer;

a third barrier layer coupled to the second quantum-well channel;

an etch-stop layer coupled to the third barrier layer; and a contact structure coupled to the etch-stop layer;

wherein:

the apparatus comprises a transistor;

the first and second quantum-well channels are channels of the transistor; and the transistor comprises:

a source structure coupled to the contact structure;

a drain structure coupled to the contact structure; and a gate electrode structure disposed in a recessed area of the contact structure, the etch stop layer and the third barrier layer.

2. An apparatus according to claim 1, wherein the first and second quantum-well channels comprise indium gallium arsenide (InGaAs), indium antimonide (InSb), or combinations thereof, and wherein the second barrier layer comprises indium aluminum arsenide (InAlAs), aluminum arsenide (AlAs), indium aluminum antimonide (InAlSb), or combinations thereof.

3. An apparatus according to claim 1, wherein the first quantum-well channel comprises a thickness of about 2 nm to 15 nm, the second quantum-well channel comprises a thickness of about 2 nm to 15 nm, and the second barrier layer comprises a thickness of about 1 nm to 6 nm, wherein the first and second quantum-well channels allow for an increase in charge barrier density without significant degradation to carrier mobility in the first and second quantum-well channels.

4. An apparatus according to claim 1, wherein the doped layer is a first doped layer and the spacer layer is a first spacer layer, the apparatus further comprising:

a second doped layer coupled to the first barrier layer; and a second spacer layer coupled to the second doped layer wherein the first quantum well channel is coupled with the first barrier layer through the intervening second doped layer and the second spacer layer, the first quantum well channel being coupled to the second spacer layer.

5. An apparatus ccording to claim 1, wherein the one or more buffer layers comprise gallium arsenide (GaAs), indium aluminum arsenide (InAlAs), or combinations thereof, the first barrier layer comprises indium aluminum arsenide (InAlAs), the spacer layer comprises indium aluminum arsenide (InAlAs), the doped layer comprises silicon (Si), the third barrier layer comprises indium aluminum arsenide (InAlAs), the etch-stop layer comprises indium phosphide (InP), and the contact structure comprises indium gallium arsenide (InGaAs).

6. A system comprising:

a processor; and a memory coupled with the processor, wherein the processor or the memory, or combinations thereof comprise one or more transistors formed in a semiconductor hetero structure, the semiconductor heterostructure comprising:

a semiconductor substrate;

one or more buffer layers coupled to the semiconductor substrate;

a first barrier layer coupled to the one or more buffer layers;

a first quantum-well channel coupled with the first barrier layer wherein the first quantum-well channel comprises a group II-VI semiconductor material;

a second barrier layer coupled to the first quantum-well channel;

a second quantum-well channel coupled to the second barrier layer wherein the second quantum-well channel comprises a group II-VI semiconductor material;

a spacer layer coupled to the second quantum-well channel:, a doped layer coupled to the spacer layer;

a third barrier layer coupled to the second quantum-well channel;

an etch-stop layer coupled to the third barrier layer; and a contact structure coupled to the etch-stop layer;

wherein:

the first and second quantum-well channels are channels of the semiconductor hetero structure; and the heterostructure comprises:

a source structure coupled to the contact structure;

a drain structure coupled to the contact structure; and a gate electrode structure disposed in a recessed area of the contact structure, the etch stop layer and the third barrier layer.

7. A system according to claim 6, wherein the processor or the memory, or combinations thereof, comprises a p-type metal-oxide-semiconductor (PMOS) device or an n-type metal-oxide-semiconductor (NMOS) device, and wherein the first and second quantum-well channels allow for an increase in charge barrier density without significant degradation to carrier mobility in the first and second quantum-well channels.

8. A system according to claim 6, wherein the first quantum-well channel comprises a thickness of about 2 nm to 15 nm, the second quantum-well channel comprises a thickness of about 2 nm to 15 nm, and the second barrier layer comprises a thickness of about 1 nm to 6 nm.

9. A system according to claim 6, wherein the doped layer is a first doped layer, the spacer layer is a first spacer layer, and the semiconductor heterostructure further comprises:

a second doped layer coupled to the first barrier layer; and a second spacer layer coupled to the second doped layer wherein the first quantum-well channel is coupled with the barrier layer through the intervening second doped layer and the second spacer layer, the first quantum-well channel being coupled to the second spacer layer.

10. A system according to claim 6, wherein the one or more buffer layers comprise gallium arsenide (GaAs), indium aluminum arsenide (InAlAs), or combinations thereof, the first barrier layer comprises indium aluminum arsenide (InAlAs), the first and second quantum well channels comprise indium gallium arsenide (InGaAs), indium antimonide (InSb), or combinations thereof, the second barrier layer comprises indium aluminum arsenide (InAlAs), aluminum arsenide (AlAs), indium aluminum antimonide (InAlSb), or combinations thereof, the spacer layer comprises indium aluminum arsenide (InAlAs), the doped layer comprises silicon (Si), the third barrier layer comprises indium aluminum arsenide (InAlAs), the etch-stop layer comprises indium phosphide (InP), and the contact structure comprises indium gallium arsenide (InGaAs).

* * * * *